(12) United States Patent
Ko et al.

(10) Patent No.: US 8,319,397 B2
(45) Date of Patent: Nov. 27, 2012

(54) PIEZOELECTRIC POWER GENERATOR

(75) Inventors: Sang Choon Ko, Daejeon (KR); Chang Han Je, Daejeon (KR); Ho Jun Ryu, Seoul (KR); Sung Sik Lee, Daejeon (KR); Chi Hoon Jun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 147 days.

(21) Appl. No.: 12/862,577

(22) Filed: Aug. 24, 2010

(65) Prior Publication Data

US 2011/0140578 A1   Jun. 16, 2011

(30) Foreign Application Priority Data

Dec. 11, 2009 (KR) .................. 10-2009-0122962

(51) Int. Cl.
*H01L 41/08* (2006.01)
(52) U.S. Cl. ....................... 310/329; 310/348
(58) Field of Classification Search .................. 310/329, 310/339
See application file for complete search history.

(56) References Cited

U.S. PATENT DOCUMENTS

| | | | |
|---|---|---|---|
| 5,801,475 A * | 9/1998 | Kimura | 310/319 |
| 6,053,045 A * | 4/2000 | Nakamura | 73/514.34 |
| 6,954,025 B2 | 10/2005 | Nishida et al. | |
| 7,078,850 B2 * | 7/2006 | Sakai | 310/339 |
| 7,260,984 B2 | 8/2007 | Roundy et al. | |
| 7,781,942 B2 * | 8/2010 | Hatano | 310/339 |
| 2009/0167110 A1 * | 7/2009 | Berkcan et al. | 310/323.01 |

FOREIGN PATENT DOCUMENTS

| | | |
|---|---|---|
| KR | 1020020059696 A | 7/2002 |
| KR | 1020030080569 A | 10/2003 |
| KR | 1020050063099 A | 6/2005 |

OTHER PUBLICATIONS

S. B. Horowitz et al., "A MEMS acoustic energy harvester", Journal of Micromechanics and Microengineering, 2006, pp. S174-S181, vol. 16, IOP Publishing Ltd., UK.
Marco Ferrari et al., "Piezoelectric multifrequency energy converter for power harvesting in autonomous Microsystems", Sensors and Actuators A, 2008, pp. 329-335, vol. 142, Elsevier B.V.

* cited by examiner

*Primary Examiner* — Mark Budd

(57) ABSTRACT

Provided is a small piezoelectric power generator applied to a wireless sensor network system of a tire pressure monitoring system (TPMS) for monitoring an internal environment of a tire such as variation in air pressure in the tire. In particular, when the system, in which air pressure, temperature and acceleration sensors are mounted, installed in the tire is operated in the TPMS for an automobile, a small piezoelectric power generator for the TPMS can be used as a power source in place of a conventional battery. The piezoelectric power generator includes a substrate having an electrode for transmitting power to the exterior, a metal plate formed on the substrate, and a piezoelectric body disposed on the metal plate and transmitting the power generated by a piezoelectric material to the electrode.

15 Claims, 5 Drawing Sheets

PIEZOELECTRIC POWER GENERATOR

CROSS-REFERENCE TO RELATED APPLICATION

This application claims the benefit of Korean Patent Application No. 10-2009-0122962, filed Dec. 11, 2009, the disclosure of which is hereby incorporated herein by reference in its entirety.

BACKGROUND

1. Field of the Invention

The present invention relates to a small piezoelectric power generator, and more particularly, to a piezoelectric power generator installed at a tire of an automobile to generate power using vibration and variation in air pressure of the tire.

2. Discussion of Related Art

Tire pressure monitoring system (TPMS) for automobiles is system for checking a tire status to support a driver in safely driving his/her car. In recent times, a system in which the TPMS is constituted by a wireless sensor network and a TPMS module is installed at a tire to communicate with the system in real time has been proposed. Therefore, the necessities of research on micro electro mechanical system (MEMS) devices having various functions and the importance of technical development to provide self-sufficient power necessary to drive sensors are being emphasized.

In addition, the TPMS mounted on the tire for an automobile should have the lifespan of 10 years or more. Accordingly, interest in devices that can generate electricity using physical quantities of tire environments, i.e., vibrations or variation in air pressure in the tire, rather than a conventional battery, is increasing.

In operations of sensor or actuator modules in various environments, in order to drive the sensor module with no battery, development of a self-sufficient power generating device still remains as an unsettled question. Researchers are researching wind, solar power, vibrations, and so on, as energy sources. Techniques of supplying energy required to the sensor module applied to the wireless sensor network from the physical quantities and extending an operation time of the sensors may provide more beneficial environments and status determining information to users.

In the conventional art, results of this research include an electricity generating device having a unit device level or a device in which a plurality of the same devices are arranged to supply generated electric power, and a bulk shape of device. In addition, in order to solve a disadvantage of the unit device level of weak power, a technique using an array of devices is being developed. However, a problem with output power of the power supply device still exists.

SUMMARY OF THE INVENTION

The present invention, therefore, solves the aforementioned problems associated with conventional devices by providing a piezoelectric power generator capable of solving a problem related to an output power and sufficiently supplying power needed to a tire pressure monitoring system by itself.

According to one aspect of the present invention, a piezoelectric power generator includes a substrate having an electrode for transmitting power to the exterior, a metal plate formed on the substrate, and a piezoelectric body disposed on the metal plate and transmitting the power generated by a piezoelectric material to the electrode.

The piezoelectric power generator may further include a mass formed on the metal plate and increasing a deformation range of the metal plate when vibration is applied to the metal plate. The metal plate may have a bridge structure having a plurality of legs about the mass. The piezoelectric power generator may further include a housing connected to the substrate and surrounding the metal plate. The housing may include an upper housing surrounding an upper surface of the metal plate, and a lower housing surrounding a lower surface of the metal plate. The piezoelectric power generator may further include a mass formed on an upper or lower surface of the metal plate and increasing a deformation range of the metal plate when vibration is applied to the metal plate; and a stopper formed at the housing and limiting displacement of the mass to prevent deformation of the metal plate from exceeding a predetermined range. The housing may have an acoustic hole, and an inner space of the housing may have a Helmholtz resonator structure so that acoustic resonance can occur in the inner space of the housing. The piezoelectric power generator may further include a ball configured to generate variation in volume of the inner space of the housing so that the acoustic resonance can be readily generated in a certain frequency region. The piezoelectric power generator may further include a bearing that can move to strike the metal plate in the inner space of the housing. The inner space of the housing may be vacuum-sealed. The metal plate may be formed of brass, stainless steel or invar. The piezoelectric power generator may be installed at the tire and may use vibrations of the tire and variation in air pressure in the tire as a power source.

According to another aspect of the present invention, a piezoelectric power generator includes a substrate having an electrode for applying power to the exterior, a plurality of metal plates formed on the substrate, and a plurality of piezoelectric bodies provided at the metal plates, respectively, and transmitting the power generated by a piezoelectric material to the electrode. Here, the plurality of metal plates have different natural frequencies.

The metal plates may have cantilever structures having different dimensions.

According to still another aspect of the present invention, a piezoelectric power generator includes a substrate having an electrode for applying power to the exterior, a silicon plate formed on the substrate, a piezoelectric body disposed on the silicon plate and transmitting power generated by a piezoelectric material to the electrode, an upper housing bonded to the substrate and surrounding an upper surface of the silicon plate, and a lower housing bonded to the substrate and surrounding a lower surface of the silicon plate.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 1A:
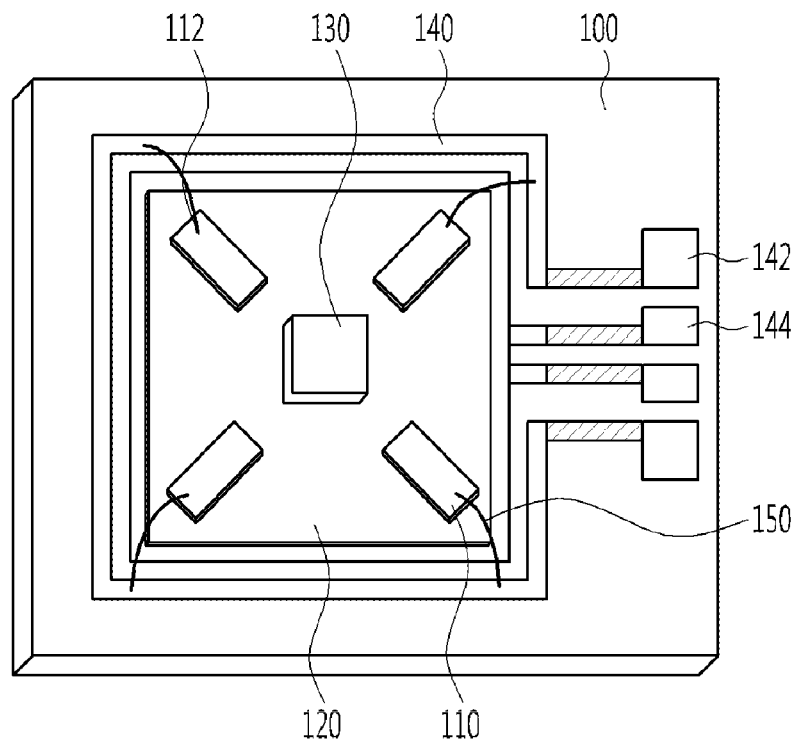
FIG. 1A is a plan view of a piezoelectric power generator mounted on a membrane metal plate structure.
Figure 1B:
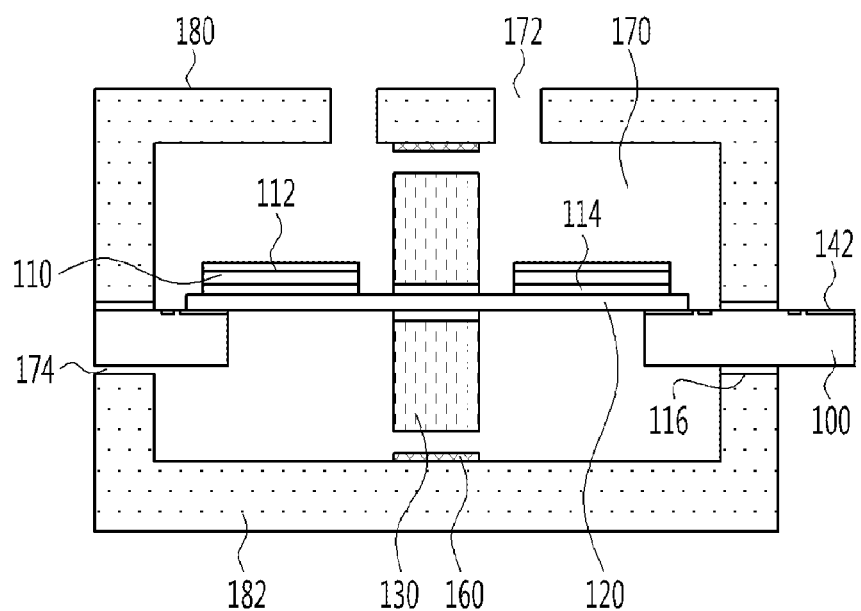
FIG. 1B is a cross-sectional view of the piezoelectric power generator having upper and lower masses at a center of the membrane structure.
Figure 1C:
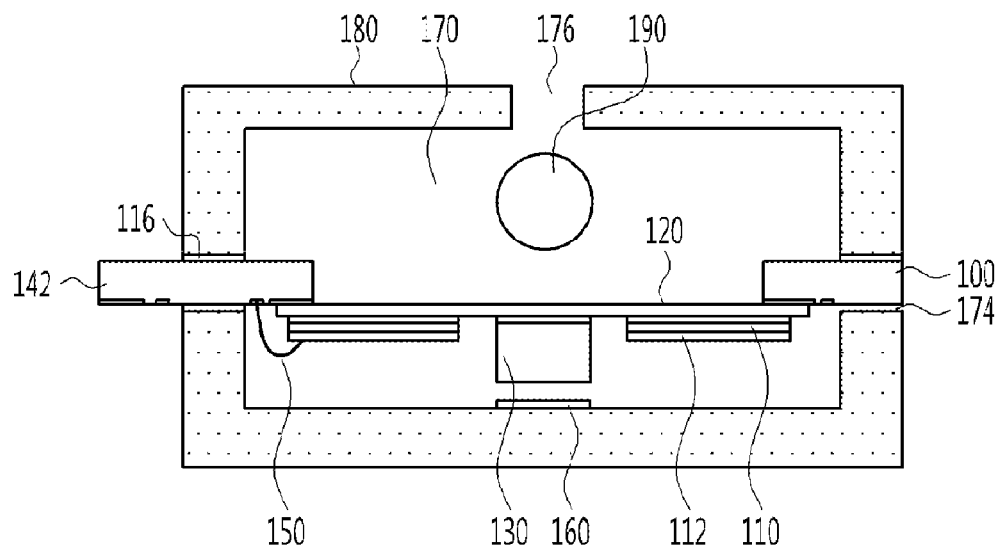
FIG. 1C is a cross-sectional view of the piezoelectric power generator having a lower mass and an upper caulk ball at a center of the membrane structure.

FIGS. 1A to 1C show a TPMS structure in accordance with a first exemplary embodiment of the present invention.

FIG. 1A is a plan view of a piezoelectric power generator mounted on a metal plate having a membrane structure. Referring to FIG. 1A, a metal plate 120 having a membrane structure formed of an elastic alloy such as stainless steel, brass, or invar, is disposed on a printed circuit board (PCB) 100, on which a metal pattern 140 is formed. In addition, a piezoelectric body 110 is bonded to the metal plate 120. Further, the metal plate 120 has an end in contact with the PCB 100 to react with external vibrations, and a center part that can freely vibrate. The piezoelectric body 110 and the metal plate 120 are bonded by epoxy to have conductivity, a piezoelectric upper electrode 112 is deposited on the piezoelectric body 110, and the piezoelectric upper electrode 112 is connected to the metal pattern 140 via a metal wire 150.

The PCB 100 includes an upper electrode 142 and a lower electrode 144, both of which are patterned to collect power generated by the piezoelectric body 110. The upper electrode 142 is connected to the piezoelectric upper electrode 112 via the metal pattern 140. The lower electrode 144 is connected to the piezoelectric body 110 via the metal pattern 140 and the metal plate 120. In addition, the power generated by the piezoelectric body 110 is transmitted to the upper and lower electrodes 142 and 144, and the transmitted power is rectified by a full wave rectifier and then stored in an electrolytic condenser or a super capacitor.

Such a structure is manufactured by making holes in the PCB 100 using a laser machining and adhesion technique so that a metal structure such as the metal plate 120 can be positioned, and forming the metal pattern 140, an upper electrode pad 142 and a lower electrode pad 144 having conductivity through plating of copper and gold.

In addition, the piezoelectric body 110 may use a piezoelectric ceramic material such as a bulk lead zirconate titanate (PZT), aluminum nitride (AlN), lead zinc niobate-lead titanate (PZN-PT), etc., which is designed such that displacement of the piezoelectric body 110 is maximized within a range of mechanical yield strength.

FIG. 1B is a cross-sectional view of the piezoelectric power generator having an upper and a lower mass at a center of a membrane structure, the upper mass being disposed on the metal plate and the lower mass being disposed under the metal plate 120. When the device mounted on an aluminum wheel inside the tire uses mechanical vibrations and variation in air pressure in the tire as a power generating source, an acoustic hole 172 is formed in an upper cavity 170 upon package of the device to be tuned with frequencies depending on the variation in air pressure. Such a structure is referred to as a Helmholtz resonator structure. The Helmholtz resonator is a structure using a natural phenomenon that a certain frequency is strongly amplified and resounded when whistles or bottles are blown by people in their daily lives. In addition, a small hole 174 is formed in a lower part of the structure to remove repulsion of the air compressed due to the displacement so that pressures in the upper and lower cavities are equal to each other. Upper and lower packages 180 and 182 having the cavity 170 may be formed of a metal or plastic material having thermal durability.

Further, the manufactured substrate is bonded to the upper package 180 functioning as an upper housing surrounding an upper surface of the metal plate, and then bonded to the lower package 182 functioning as a lower housing surrounding a lower surface of the metal plate. A stopper 160 is provided in the package and functions as a bumper for an automobile to prevent damage to the device due to large mechanical impacts, etc. The stopper 160 functions to reduce structural destruction and fatigue of mechanical materials of the impact absorbing and power generating apparatus, which is devised to increase durability of the electricity generating device in severe vibration environments such as automobiles. Specifically, displacement of the mass 130 may be limited to prevent deformation of the metal plate 120 from exceeding a specific range. In addition, an insulating epoxy 116 may be provided between the PCB 100 and the upper and lower packages 180 and 182 to insulate therebetween.

FIG. 1C is a cross-sectional view of the piezoelectric power generator having a lower mass disposed under the metal plate 120 and an upper caulk ball at a center of the membrane structure. Referring to FIG. 1C, the upper package 180 has an acoustic hole 176, and a ball 190 formed of a thermal-resistance and light weight material is provided in the inner space of the Helmholtz resonator. The ball 190 functions to vary a volume in the Helmholtz resonator to increase displacement of the specific frequency band. When the piezoelectric power generator in accordance with the present invention is installed on an aluminum wheel inside the tire, two physical quantities, i.e., variation in air pressure generated in the tire and mechanical vibration, can be used as a source for piezoelectric power.

One side of the device is designed as the cavity of the Helmholtz resonator structure to maximize displacement of the metal plate 120 due to variation in air pressure so that acoustic resonance can occur due to the variation in air pressure. In addition, like the theory of the whistle, the ball 190 having thermal resistance and lightweight properties may be disposed in the cavity to cause variation in acoustic volume to generate acoustic resonance at a specific frequency so that displacement of the metal plate 120 can be further increased. This is the same effect as that the caulk ball is rotated when the whistle is blown to cause variation in volume in the resonator so that sound is amplified more at a specific frequency region.

While the above description describes that the piezoelectric body 110 is deposited on the metal plate 120, a silicon material may be used instead of the metal plate 110 to be bonded to the piezoelectric body through a semiconductor process, thereby manufacturing the piezoelectric power generator.

Figure 2A:
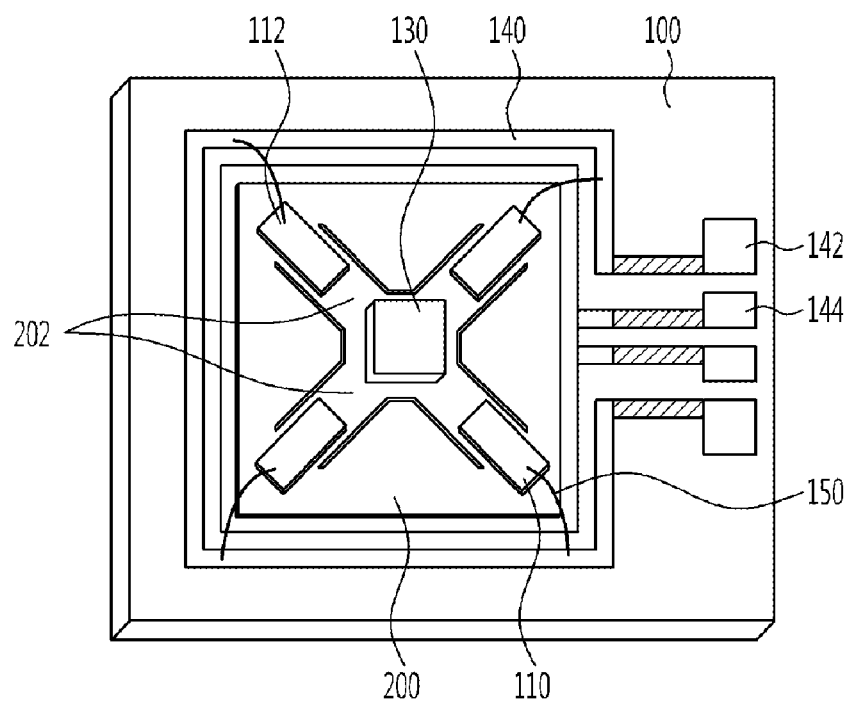
FIG. 2A is a plan view of a piezoelectric power generator mounted on a bridge metal plate structure.
Figure 2B:
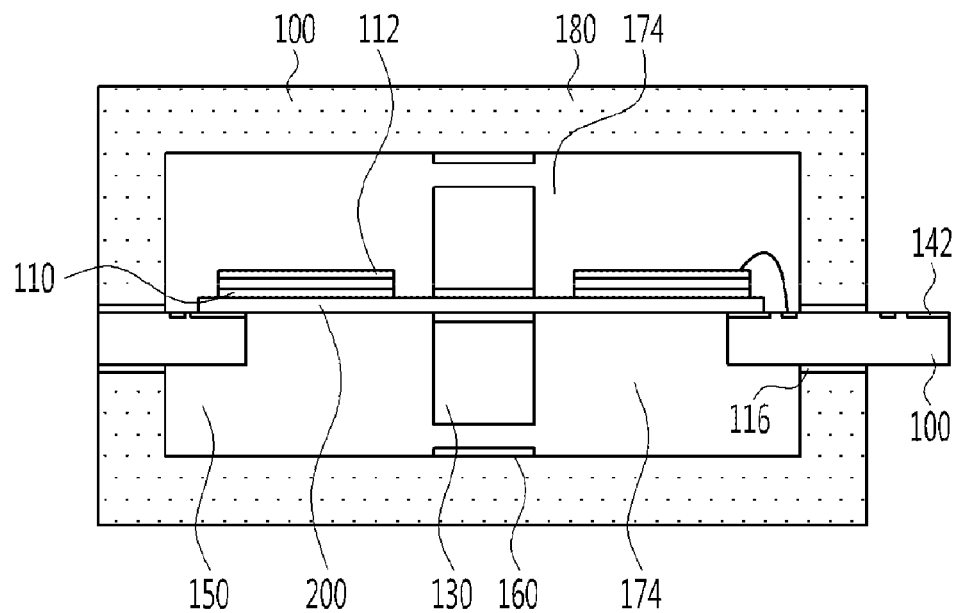
FIG. 2B is a cross-sectional view of the piezoelectric power generator having upper and lower masses disposed at a center of the bridge structure.
Figure 2C:
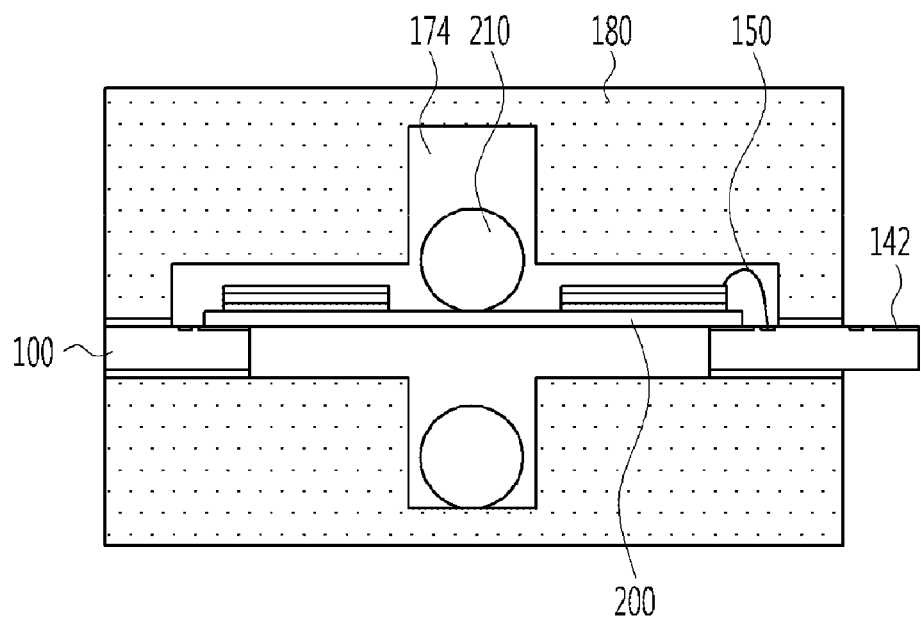
FIG. 2C is a cross-sectional view of the piezoelectric power generator having a metal bearing mounted on a center of the bridge structure.

FIGS. 2A to 2C show a TPMS structure in accordance with a second exemplary embodiment of the present invention. FIG. 2A is a plan view of a piezoelectric power generator mounted on a bridged metal plate structure.

Referring to FIG. 2A, unlike FIG. 1A, a metal plate 200 has a bridge structure with a plurality of legs 202 about a mass 130. This is because such a structure can further increase displacement due to vibrations. The metal plate may be machined by a Femto laser, or manufactured by patterning through photolithography and then wet-etching.

FIG. 2B is a cross-sectional view of the piezoelectric power generator having upper and lower masses at a center of the bridge structure. Referring to FIG. 2B, the upper and the lower metal mass 130 are bonded to upper and lower parts of the metal plate 200 to tune the frequency respectively. Stoppers 160 may be installed in the upper and lower packages 180 and 182. Therefore, it is possible to increase the power generation due to vibrations through the metal plate 200 and the metal mass 130, which are bridged.

FIG. 2C is a cross-sectional view of the piezoelectric power generator having a metal bearing mounted on a center of the bridge structure.

Referring to FIG. 2C, centers of the upper and lower packages 180 and 182 are recessed so that metal bearings 210 can be inserted into the recessed spaces. The bearings 210 can strike the bridged metal plate 200, and the piezoelectric body 110 can collect vibrations of the metal plate 200 generated at this time. This is a method of using the weight and potential energy of the bearings and vibration energy generated therefrom as an electricity generating source. This is the same theory as a ball mill in which balls having potential energy are dropped to finely grind powder, when fine ceramic powder is manufactured.

When the piezoelectric power generator according to the embodiment is installed at a rotary mechanism such as an aluminum wheel for an automobile, potential energy generated by repeatedly turning the device upside down can be additionally used as a power source.

Figure 3A:
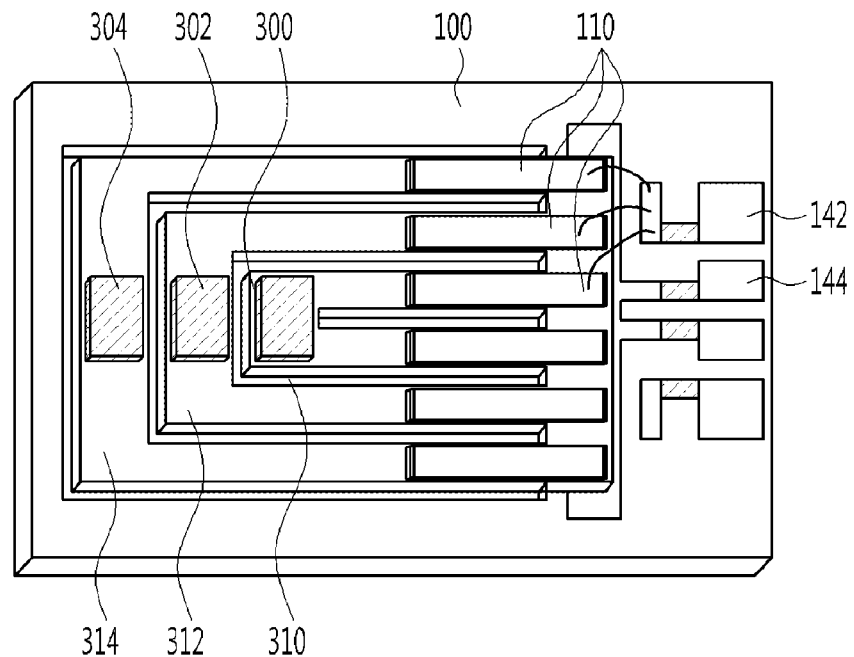
FIG. 3A is a plan view of a small piezoelectric power generator having a three-stage cantilever structure.
Figure 3B:
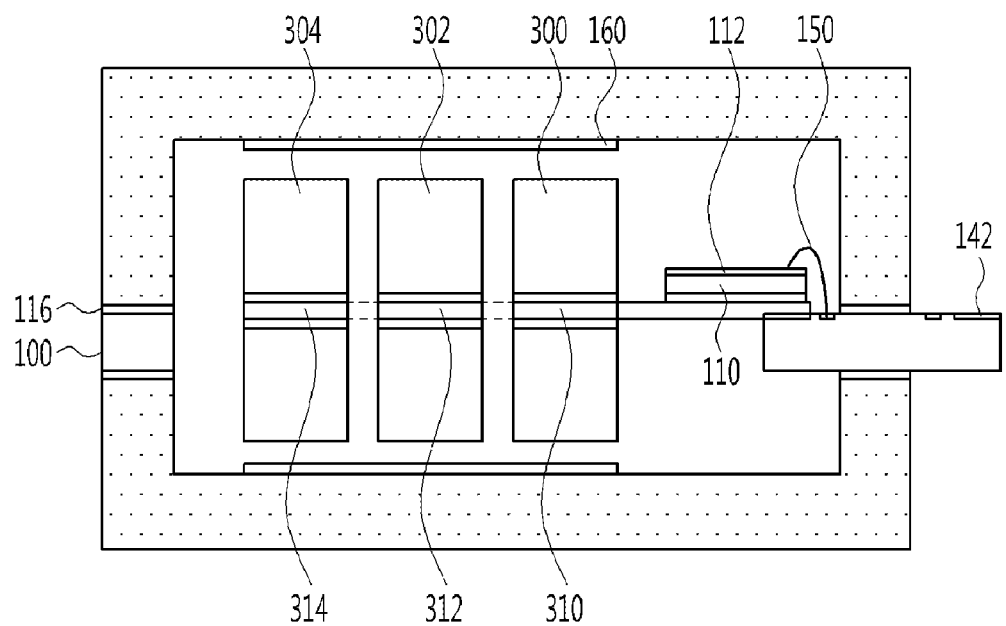
FIG. 3B is a cross-sectional view of the small piezoelectric power generator having a three-stage cantilever structure and a metal mass.
Figure 3C:
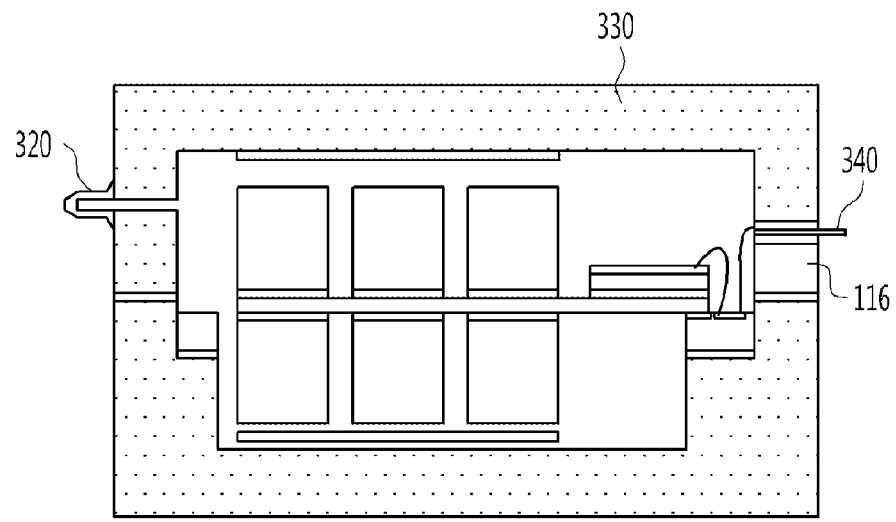
FIG. 3C is a cross-sectional view of the small piezoelectric power generator having a three-stage cantilever structure, which is vacuum-packaged.

FIGS. 3A to 3C show a TPMS structure in accordance with a third exemplary embodiment of the present invention. FIG. 3A is a plan view of a small piezoelectric power generator having a three-stage cantilever structure. Referring to FIG. 3A, the three-stage cantilever structure is manufactured by machining metal plates 310, 312 and 314. Three metal bodies 300, 302 and 304 are attached to the metal plates 310, 312 and 314 having different resonance points in the same device, respectively. The three cantilever metal plates 310, 312 and 314 having different resonance points can effectively generate power even when a frequency of vibrations generated by variation in speed of a moving vehicle is varied. That is, the third embodiment is different from the first and second embodiments in that the three-stage cantilever metal plates 310, 312 and 314 have different frequency bands so that high output power can be obtained within a wide frequency range. While this embodiment illustrates the three-stage cantilever, a four or more stage of cantilever may be used.

FIG. 3C is a cross-sectional view of the small piezoelectric power generator having a vacuum-packaged three-stage cantilever structure. Referring to FIG. 3C, the interior of the small piezoelectric power generator is vacuum packaged. As described above, the interior of the device is vacuum packaged to reduce affection by air damping so that displacement of the metal plates 310, 312 and 314 can be further increased. As a result, it is possible to sufficiently supply power necessary to a tire pressure monitoring wireless sensor network by itself during actual operation thereof.

Upper and lower electrodes 142 and 144 may transmit power to the exterior of the package through a metal lead wire 340. Here, the metal lead wire 340 is surrounded by an insulating epoxy 350 to be insulated from the upper and lower packages 180 and 182. An end 320 of a copper pipe is connected to the packages 180 and 182 of the small piezoelectric power generator to exhaust air from the interior thereof to create a vacuum. The end 320 of the copper pipe is sealed after the interior of the piezoelectric power generator is vacuumed.

Figure 4:
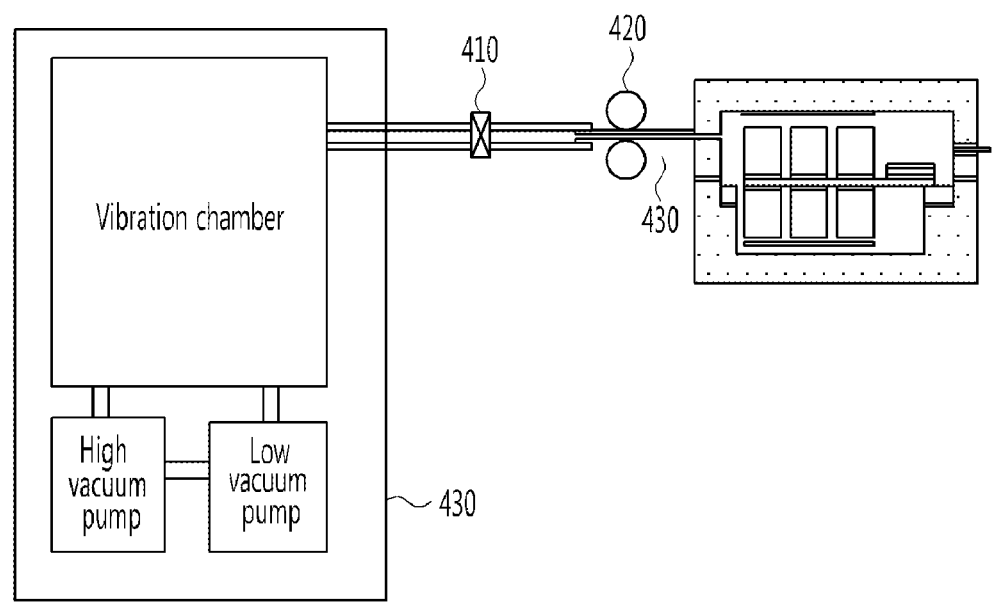
FIG. 4 is a view for explaining a vacuum packaging process of a small piezoelectric power generator having a three-stage cantilever structure.

FIG. 4 is a view for explaining a vacuum packaging process of a small piezoelectric power generator having a three-stage cantilever structure. A vacuum chamber 440 is connected to the manufactured device via a valve 410 using the copper pipe 430 so that the pressure in the vacuum chamber is controlled to be equal to the pressure in the device. Then, the copper pipe 430 of the device is strongly compressed by a mechanism such as a roller 42 to be sealed in a vacuum state.

The piezoelectric power generator manufactured in accordance with the first, second or third exemplary embodiment of the present invention rectifies the generated electricity through a full wave-rectifier to continuously accumulate the electricity in a condenser. The accumulated electricity can be used to supply power to the sensor module applied to the wireless sensor network so that environmental information can be provided from the sensor module with a vibration-existing range. As a result, it is possible to solve the problem of supplying power which is required for the wireless sensor network with no battery.

The piezoelectric power generator in accordance with the first, second or third exemplary embodiment of the present invention may be applied to a wireless sensor network system of a TPMS for monitoring an environment in a tire for an automobile such as variation in air pressure in the tire. In particular, when the system, in which air pressure, temperature and acceleration sensors are mounted, installed in the tire is operated in the TPMS for an automobile, the small piezoelectric power generator in accordance with an exemplary embodiment of the present invention can be used as a power source in place of a conventional battery.

Since the internal environment of the tire for an automobile varies depending on certain vibrations during driving, variation in air pressure generated by a surface thereof in contact with a road surface, and variation in speed, the piezoelectric power generator in accordance with an exemplary embodiment of the present invention can generate power using vibrations and variation in pressure generated in the tire. In addition, in operation of the sensor module for monitoring a specific environment in which vibration and pressure always vary, it is possible to replace a conventional power apparatus with the piezoelectric power generator.

Further, as an example of another application of the present invention, the piezoelectric power generator may be used in a wireless sensor module for a marine observation system for measuring a wind speed, a wave height, or the like. Conventionally, the observation system on a marine surface is constituted as a buoy floating on a water surface in a sea or river so that the piezoelectric power generator of the present invention can be installed therein to function as a power supply device of a marine observation sensor network using variation in wave height due to wind, etc., as an input vibration source.

As can be seen from the foregoing, a batteryless power supply device that can be used in an apparatus installed at a place in which vibrations and air pressures vary, for example, a TPMS installed in a tire for an automobile, can be provided. When it is used as a power supply device of the TPMS, a piezoelectric power generator uses vibrations of the tire and variation in air pressure in the tire as an electric power source. In this embodiment of the present invention, electric power can be effectively generated using the electric power source.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A piezoelectric power generator comprising:
a housing having an acoustic hole so that an inner space of the housing is configured to have a Helmholtz resonator structure;
a substrate disposed in the housing and coupled to an electrode configured to transmit power to an external device;
at least one conductive plate formed over the substrate; and
a piezoelectric body disposed over the conductive plate and configured to transmit power generated by a piezoelectric material to the electrode.

2. The piezoelectric power generator of claim 1, the piezoelectric power generator further comprising:
a mass formed over the conductive plate, the mass being configured to increase to a degree of deformation of the conductive plate when pressure is applied to the conductive plate.

3. The piezoelectric power generator of claim 2, wherein the conductive plate includes a bridge structure comprising a plurality of legs extending near the mass.

4. The piezoelectric power generator of claim 1,
wherein the substrate includes first and second substrates which are spaced apart from each other, and
wherein the conductive plate is bridged between the first and the second substrate.

5. The piezoelectric power generator of claim 1, wherein the housing comprises:
an upper housing enclosing an upper surface of the substrate to form an upper cavity, and
a lower housing enclosing a lower surface of the substrate to form a lower cavity,
wherein the acoustic hole is formed in the upper housing or the lower housing.

6. The piezoelectric power generator of claim 1, the piezoelectric power generator further comprising:
a mass formed over an upper surface of the conductive plate or below a lower surface of the conductive plate, the mass being configured to increase a degree of deformation of the conductive plate when pressure is applied to the conductive plate; and
a stopper formed in the housing and configured to limit displacement of the mass and prevent damage to the conductive plate due to excessive displacement of the mass.

7. The piezoelectric power generator of claim 2,
wherein the mass is configured to apply first pressure generated by mechanical vibration of the conductive plate to the conductive plate, and
wherein the acoustic hole is configured to apply second pressure generated by air vibration in the housing to the conductive plate.

8. The piezoelectric power generator of claim 1, the piezoelectric power generator further comprising:
a ball configured to generate pressure by generating air variation in the housing so as to facilitate generation of an acoustic resonance.

9. A piezoelectric power generator comprising:
a housing;
a substrate disposed in the housing and coupled to an electrode configured to transmit power to an external device;
at least one conductive plate formed over the substrate;
a piezoelectric body disposed over the conductive plate and configured to transmit power generated by a piezoelectric material to the electrode; and
a bearing configured to move in the housing and strike the conductive plate so that the bearing applies (i) a first pressure generated by mechanical vibration of the conductive plate to the conductive plate, and (ii) a second pressure generated by air vibration in the housing to the conductive plate.

10. The piezoelectric power generator of claim 9, wherein an inner space of the housing is vacuum-sealed.

11. The piezoelectric power generator of claim 1, wherein the conductive plate includes brass, stainless steel, or invar.

12. The piezoelectric power generator of claim 1, wherein the piezoelectric power generator is installed on a tire and uses mechanical vibrations generated by movement of the tire and air vibrations generated in the housing as a power source.

13. The piezoelectric power generator of claim 1, wherein a plurality of conductive plates are placed in the housing,
wherein each of the plurality of conductive plates each has a cantilever structure.

14. The piezoelectric power generator of claim 13, wherein the conductive plates of the plurality of conductive plates each have different resonance points from each other.

15. The piezoelectric power generator of claim 1,
wherein the conductive plate is silicon plate.

* * * * *